(12) United States Patent
Colli

(10) Patent No.: US 9,130,085 B2
(45) Date of Patent: Sep. 8, 2015

(54) TRANSPARENT PHOTODETECTOR FOR MOBILE DEVICES

(71) Applicant: Nokia Corporation, Espoo (FI)

(72) Inventor: Alan Colli, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 351 days.

(21) Appl. No.: 13/857,484

(22) Filed: Apr. 5, 2013

(65) Prior Publication Data

US 2014/0299741 A1   Oct. 9, 2014

(51) Int. Cl.
*H01L 31/0352*   (2006.01)
*H01L 31/028*   (2006.01)
*H01L 31/101*   (2006.01)
*H01L 31/113*   (2006.01)

(52) U.S. Cl.
CPC ...... *H01L 31/035218* (2013.01); *H01L 31/028* (2013.01); *H01L 31/1013* (2013.01); *H01L 31/1016* (2013.01); *H01L 31/113* (2013.01); *Y02E 10/547* (2013.01)

(58) Field of Classification Search
CPC ............ H01L 31/0352; H01L 31/1016; H01L 31/113; Y02E 10/547
USPC .................. 250/214.1, 200; 257/21, 290–292
See application file for complete search history.

(56) References Cited

U.S. PATENT DOCUMENTS

| 8,698,226 | B2 * | 4/2014 | Jain et al. ........................ 257/317 |
| 8,927,964 | B2 * | 1/2015 | Colli et al. ...................... 257/21 |
| 2010/0025660 | A1 * | 2/2010 | Jain et al. ........................ 257/24 |
| 2011/0278541 | A1 | 11/2011 | Huang et al. .................... 257/21 |
| 2013/0032782 | A1 | 2/2013 | Gerasimos et al. ............. 257/21 |
| 2013/0049738 | A1 | 2/2013 | Sargent ........................... 324/96 |

OTHER PUBLICATIONS

Trivedi et al. Field-Effect Transistors with Graphene Channels and Quantum Dots: Gate Control and Photo-induced Effects. In: IEEE, International Conference on Nanotechnology. p. 1584-1587. ISSN 1944-9399. Aug. 15, 2011.
Klekachev et al. Electron accumulation in graphene by interaction with optically excited quantum dots. Physica E 43 (2011) pp. 1046-1049, ISSN 1386-9477. Dec. 22, 2010.
G. Konstantatos, et al., "Hybrid grapheme-quantum dot phototransistors with ultrahigh gain", Nature Nanotechnol. 7, 363-368, (2012), 18 pgs.
http://www.invisage.com/technology; Apr. 5, 2013, 5 pgs.
A.Colli, et al. "Photodetection", U.S. Appl. No. 13/681,676, filed Nov. 20, 2012, 31 pgs.

* cited by examiner

*Primary Examiner* — Seung C Sohn
(74) *Attorney, Agent, or Firm* — Harrington & Smith

(57) ABSTRACT

An apparatus comprises a graphene film; a first arrangement of quantum dots of a first type located in contact with the graphene film as a first monolayer; a second arrangement of quantum dots of a second type located in contact with the graphene film as a second monolayer; an input voltage source connected to an end of the graphene film; and an output voltage probe connected to the graphene film between the first arrangement of quantum dots and the second arrangement of quantum dots.

16 Claims, 6 Drawing Sheets

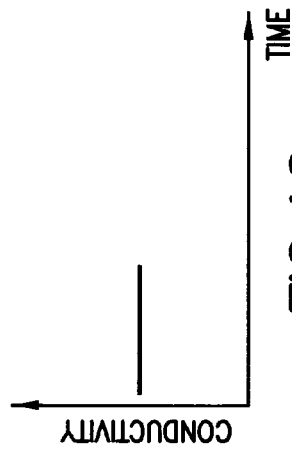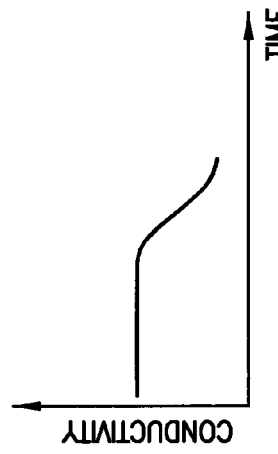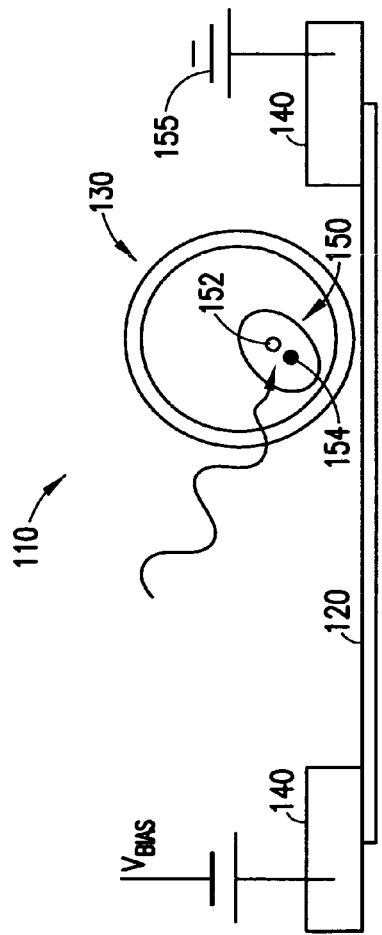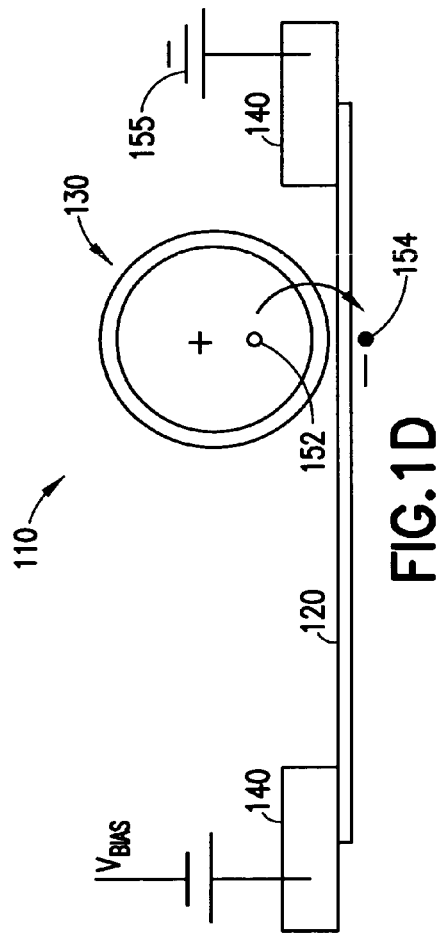

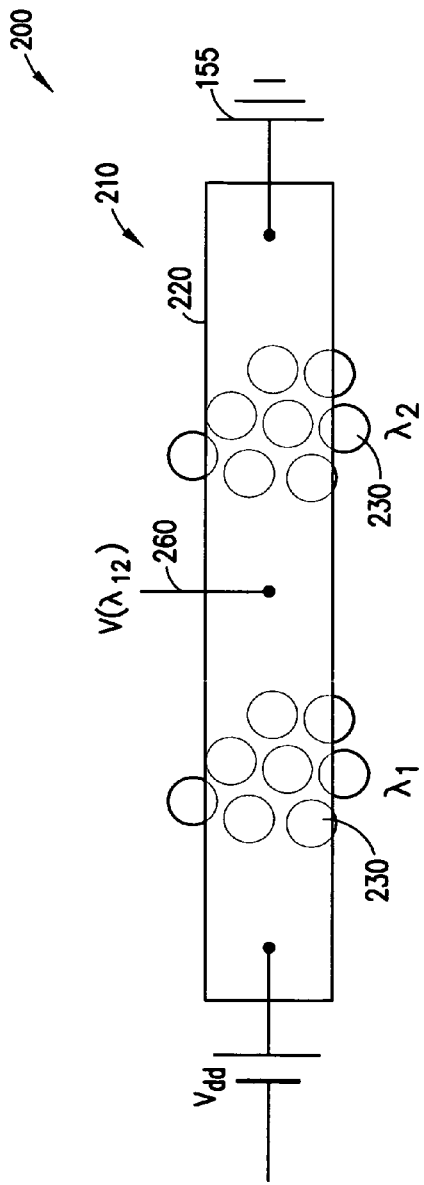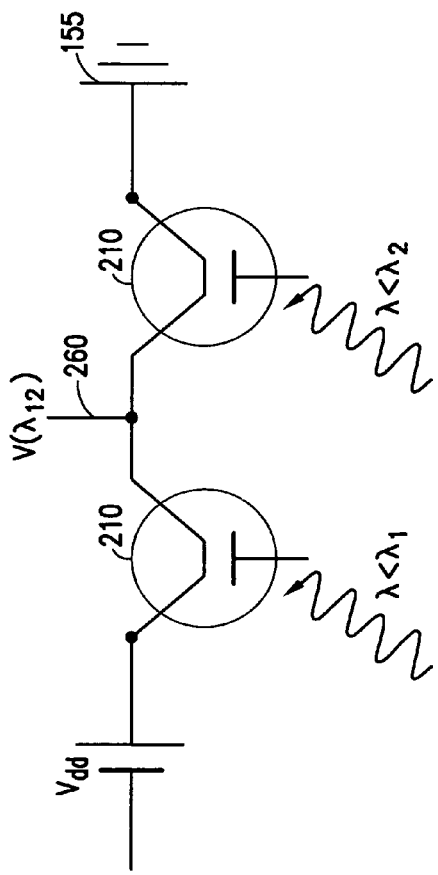

TRANSPARENT PHOTODETECTOR FOR MOBILE DEVICES

BACKGROUND

1. Technical Field

The exemplary and non-limiting embodiments described herein relate generally to ambient-light sensors in mobile devices and, more particularly, to narrow-bandwidth photodetectors for mobile devices.

2. Brief Description of Prior Developments

Ambient-light sensors are included in most mobile devices. Such sensors adjust the luminosity of a display of the mobile device according to the background light in order to facilitate legibility and power management. The core element of an ambient-light sensor is a photodetector device. Currently, most ambient-light sensors use silicon photodiodes as the photodetector device. Since silicon is a poor light absorber, it follows that such sensors occupy a fairly large area or are generally quite bulky due to significant thickness being required to absorb sufficient light.

The specifications of various commercially available photodetector devices pose a number of requirements when they are integrated into a case of a mobile device. For example, space on surfaces of mobile devices is at a premium. On one hand, it is generally desirable to have several features embedded in a handset of a mobile device. On the other hand, it is also desirable to have thinner and lighter mobile devices in which a planar surface is occupied by the largest screen possible. A trade-off is generally made with regard to the number of features and the size of the screen, thereby leaving little room for sensors that need a direct interface with the environment.

SUMMARY

The following summary is merely intended to be exemplary. The summary is not intended to limit the scope of the claims.

In accordance with one aspect, an apparatus comprises a graphene film; a first arrangement of quantum dots of a first type located in contact with the graphene film as a first monolayer; a second arrangement of quantum dots of a second type located in contact with the graphene film as a second monolayer; an input voltage source connected to an end of the graphene film; and an output voltage probe connected to the graphene film between the first arrangement of quantum dots and the second arrangement of quantum dots.

In accordance with another aspect, a method comprises receiving incident light on a first arrangement of quantum dots of a first type located in contact with a first graphene film as a first monolayer and on a second arrangement of quantum dots of second type located in contact with the first graphene film as a second monolayer; modulating a conductivity of the first graphene film based on wavelengths of the received incident light; and outputting a voltage from a point between the first arrangement of quantum dots and the second arrangement of quantum dots.

In accordance with another aspect, a non-transitory computer readable storage medium, comprising one or more sequences of one or more instructions which, when executed by one or more processors of an apparatus, cause the apparatus to at least: modulate a conductivity of a graphene film based on wavelengths of a received incident light; and output a voltage from a point between a first arrangement of quantum dots and a second arrangement of quantum dots on the graphene film.

BRIEF DESCRIPTION OF THE DRAWINGS

The foregoing aspects and other features are explained in the following description, taken in connection with the accompanying drawings, wherein:

FIG. 1b is a schematic representation of photogenerated charges of electrons and holes in a QD of the phototransistor of FIG. 1a;

FIG. 1c is a graphical representation of the conductivity of the graphene film of the phototransistor of FIG. 1a over time;

FIG. 1d is a schematic representation of an electron being transferred to the graphene film of the phototransistor of FIG. 1a;

FIG. 1e is a graphical representation of the conductivity of the graphene film over time as electrons are transferred to the graphene film;

FIG. 2a is a schematic representation of a photodetector using a graphene film and two domains of QDs with different band gaps;

FIG. 2b is a schematic representation of the photodetector of FIG. 2a modeled as two phototransistors;

DETAILED DESCRIPTION OF EMBODIMENT

Figure 1A:
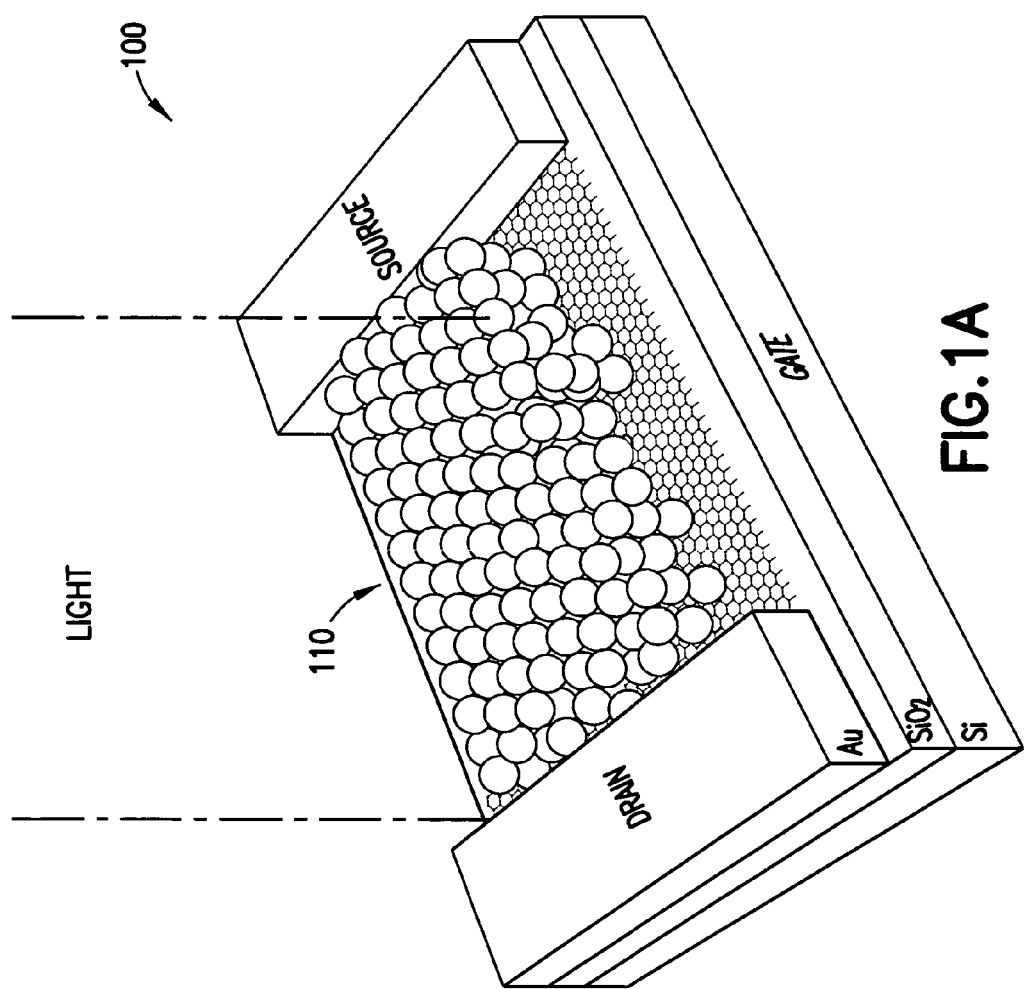
FIG. 1a is a perspective view of a phototransistor comprising a graphene film and quantum dots (QDs)

Most ambient-light sensors simply detect the amount of incident light received the sensor over the whole visible spectrum. If even a minimum level of spectral discrimination was possible, such a sensor would enable more features in the field of user contextualization and ambient intelligence. In other words, a user of a device incorporating such a sensor would be able to extract useful information on the device and its surroundings by analyzing the illumination patterns at different times and places. This could be done by applying different filters over an array of sensors. However, the use of filters may be less than optimally efficient with regard to usage of the surface area of the device. Furthermore, the sensor may not be transparent.

Desirable sensors are those that can be miniaturized in order to occupy only a tiny area on a surface or screen of a mobile device (e.g., a telephone handset, tablet, computer, camera, or the like). Such sensors are also transparent (or at least substantially transparent so as not to be noticed) allowing them to be installed directly on top of the screen without impinging on any additional dedicated area. As used herein, a "transparent" photodetector is suitably sensitive so as to absorb only a small fraction of incident light while still being able to generate a measurable signal.

Referring to the Figures herein, exemplary embodiments of photodetectors comprising systems of QDs and graphene are illustrated. Such systems allow for the incorporation of small, transparent, and color-sensitive ambient-light detectors for use as chromatic eyes in mobile devices. Although the features of these photodetectors will be described with reference to the example embodiments shown in the drawings, it should be understood that other features can be embodied in many alternate forms of embodiments. In addition, any suitable size, shape, or type of elements or materials could be used.

One exemplary type of photodetector comprises a combination of semiconductor quantum dots (QDs) and graphene. The materials of the QDs include III-V compounds or II-VI (e.g., chalcogenide) compounds in their basic forms or combined into heterostructures. The materials of the QDs are not so limited, as other semiconductor materials may be employed. For example, another exemplary type of photodetector comprises a combination of nanocrystals and graphene, where the nanocrystals are larger than quantum dots. Possible shapes for nanocrystals include, but are not limited to, spheres, rods, ribbons, tetrapods, rings, combinations of the foregoing shapes, and the like. Although the exemplary embodiments herein are described in terms of QDs, it should be understood that any of the exemplary embodiments described can employ nanocrystals.

A model for this exemplary type of photodetector is illustrated in FIGS. 1a, 1b, and 1d and is designated generally by the reference number 100 and hereinafter referred to as "photodetector 100." Photodetector 100 comprises one or more phototransistors 110, each phototransistor 110 being defined by a graphene film 120 at least partially covered by semiconductor QDs 130 of band-gap $E_G$, the phototransistor 110 being connected to electrode leads 140 respectively connected to a voltage bias $V_{bias}$ and a ground 155. The QDs 130 absorb impinging photons of energy E, where E>$E_G$, thereby producing electron-hole pairs 150 comprising photogenerated charges of electrons 152 and holes 154 in the QDs 130, as illustrated in FIG. 1b. A conductivity of the graphene film 120 is constant over time, as illustrated in FIG. 1c, with regard to the electron-hole pairs 150 in the QDs 130. As illustrated in FIG. 1d, upon the electron-hole pairs 150 being produced, either the electrons 152 or the holes 154 transfer to the graphene film 120 (the electrons 152 and the holes 154 being oppositely charged), while the other remains trapped in the QDs 130 as a carrier. In the exemplary embodiment illustrated, one of the electrons 152 is transferred to the graphene film 120. The trapped carriers produce a photogating effect, thereby chancing a conductivity of the graphene film 120 through capacitive coupling. As shown in FIG. 1(e), the conductivity of the graphene film 120 changes over time. Whether the conductivity of the graphene film 120 increases or decreases upon illumination depends on both the graphene doping and the charging of the QDs 130. More specifically, for a positive QD charge and p graphene doping, conductivity decreases; for a positive QD charge and n graphene doping, conductivity increases; for a negative QD charge and p graphene doping, conductivity increases; and for a negative QD charge and n graphene doping, conductivity decreases.

Which charge is ultimately trapped in a QD 130 as a carrier depends on the particular band-alignment between the graphene molecules of the graphene film 120 and the material of the QD 130. This can also be controlled by an external field.

One feature of the phototransistor 110 is an ultra-high sensitivity, which may potentially reach a single-photon level under certain conditions. Other features of the phototransistor 110 relate to size (e.g., relatively small) and transparency. There is a trade-off between sensitivity and transparency of the phototransistor 110. In particular, a thick layer of QDs 130 will provide a large absorption of incident light and thus high-sensitivity, but light transmission will be relatively low. Conversely, a monolayer of QDs 130 will provide a high degree of transparency but a much lower sensitivity. With regard to the exemplary embodiment disclosed herein, monolayers of the QDs 130 are still suitably sensitive to respond under normal ambient-light conditions. in short, phototransistors 110 comprising both QDs 130 and graphene films 120 possess various features that make them attractive components for advanced ambient-light detectors for use as chromatic eyes. The exemplary designs and assembly configurations of phototransistors comprising QDs and graphene films provide the exemplary embodiments of narrow-bandwidth photodetectors disclosed herein.

As shown in FIG. 2a, another exemplary embodiment of a photodetector is designated generally by the reference number 200 and is hereinafter referred to as "photodetector 200." It should be noted that the photodetector 100 illustrated in FIG. 1a is one exemplary form of a potentially small and transparent ambient-light detector. However, the photo transistor 100 thereof responds to all photon energies above $E_G$, not allowing for effective spectral discrimination. The photodetector 200, as well as the exemplary embodiments of photodetectors subsequently-described herein, involves employing a phototransistor 210 as a spectral sensitive apparatus while retaining the benefits of small size and transparency.

The photodetector 200 FIG. 2a is bandwidth photodetector. A bandwidth photodetector is usually full-visible-range photodetector covered by a material that acts as a band-pass filter. In the photodetector 200, bandwidth narrowed to produce narrow-bandwidth photodetector. Band-pass filters are not used in the exemplary embodiments of the narrow-bandwidth photodetectors disclosed herein because of lack transparency associated with the material of the band-pass filters.

In the photodetector 200, bandwidth is narrowed by using only a thin layer of graphene or graphene film 220 (e.g., one or a few atoms thick) and QDs 230 arranged as monolayers on the graphene film 220, thus maintaining the transparency feature for a system employing the photodetector 200. In the exemplary embodiments of the photodetectors subsequently described, only monolayers of QDs 230 are used, even if a few stacked layers of QDs 230 would be more sensitive and still suitably transparent. Also, with regard to the subsequently-described embodiments, the following convention is adopted: $\lambda_{n+1} < \lambda_{(n)(n+1)} < \lambda_n$ where $\lambda$ is a wavelength of light and n denotes a particular domain of QDs 230.

In the exemplary embodiments of the photodetectors described in FIG. 2a, the graphene film 220 is shaped as a ribbon ("the channel") in contact with two different types QDs 230 (e.g., different materials) prepared as isolated domains and located on, in, or otherwise disposed in contact with the graphene film 220. The channel is connected to an input voltage source (e.g., a DC source) on one side ($V_{dd}$) and to around 155 at the other side such that a current flows through the graphene film 220. A voltage probe 260 is conned mid-channel between the two QD domains. As shown in FIG. 2b, the portions of the channel in contact with the QDs 230 behave as the phototransistors 210, receiving incident light and responding to wavelengths of light shorter than those associated with the band-gap of the QDs 230 ($\lambda_1$ and $\lambda_2$, respectively).

Referring to both FIGS. 2a and 2b, the phototransistors 210 do not respond for $\lambda > \lambda_1$. However, in one exemplary embodiment, if the two types of QDs 230 differ only because of their band-gaps, but not in terms of density and band-alignment with graphene, then each phototransistor 210 will react equally for $\lambda < \lambda_2$, locally modulating the graphene conductivity by a similar amount. As a result, the overall current flowing through the channel changes, but the mid-channel output voltage remains approximately constant. In another exemplary embodiment, for $\lambda_2 < \lambda < \lambda_1$, only one side of the channel is modulated (via the QD or nanocrystal domain 1 with associated absorption edge $\lambda_1$ (shown at 230)), and the output voltage $V(\lambda_{12})$ changes accordingly, reflecting the asymmetric potential drop on the two sides of the channel. Hence, the system behaves as a bandwidth photodetector. Since the output of the bandwidth photodetector responds only to wavelengths in a defined range, which can be made as narrow as the band-gap difference between the different QDs 230 by selecting QD materials of desired band-gaps, the bandwidth photodetector is a narrow-bandwidth photodetector.

Figure 3:
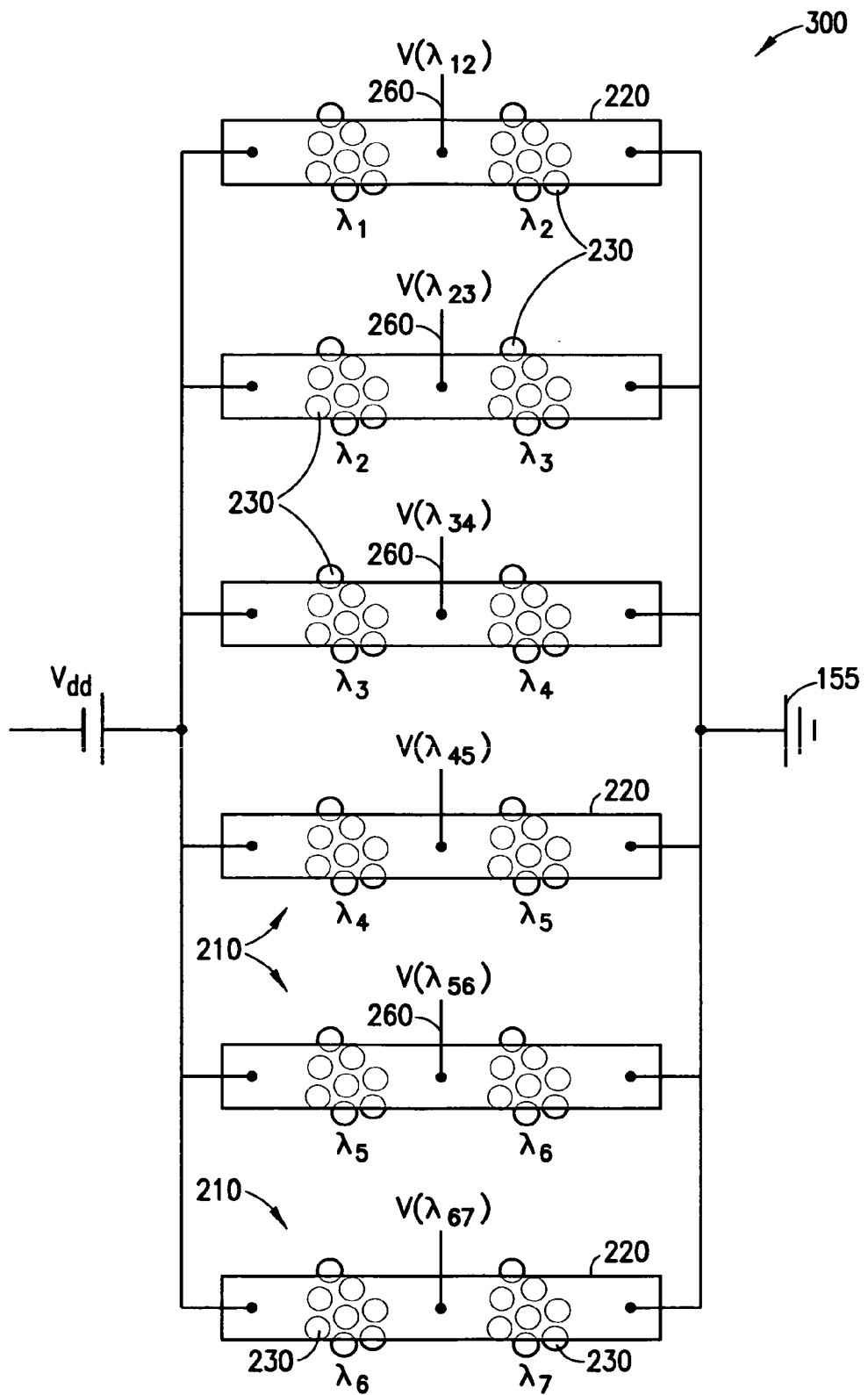
FIG. 3 is one exemplary embodiment of a photodetector comprising an array of bandwidth phototransistors arranged in parallel.

Referring now to FIG. 3, one exemplary embodiment of a photodetector for use as a chromatic eye is illustrated and designated generally by the reference number 300. The chromatic eye 300 may connected to a processor. Two or more phototransistors 210 as described above can be used to receive incident light. In doing so, the graphene film is modulated by the different QDs 230 to provide spectral discrimination (e.g., via the processor) over an arbitrary wavelength range. In one configuration, an array of phototransistors 210 covering consecutive bands within a spectral range of interest is assembled in a parallel configuration, with one side of each graphene film 220 connected to the input voltage source ($V_{dd}$), the other side of each graphene film 220 connected to ground 155, and the voltage probe 260 connected mid-channel between the two QDs domains.

The parallel array configuration allows the chromatic eye to perform a deterministic calibrated spectral analysis (e.g., via the processor). Increasing the number of phototransistors 210 in the array improves the resolution of the spectral analysis but involves a more complex fabrication process and circuitry arrangement (for example, because one voltage is output per phototransistor).

For suitable operation of the chromatic eye 300, the phototransistors 210 operate below a saturation voltage, which is the point at which the illumination source produces the maximum output voltage from the phototransistor. Saturation may occur at high illumination intensities, particularly when the number of charges trapped in the QDs 230 is so large that it becomes difficult to add more charges even as photon flux is further increased. For example, if the impinging light has a very intense blue component, all phototransistors 210 with bandwidths from red to cyan may become saturated, hindering proper detection of any sub-blue component. While saturation can observed when an intense laser spot is used for excitation, photon density saturation is unlikely be a significant issue in ambient light.

Figure 4:
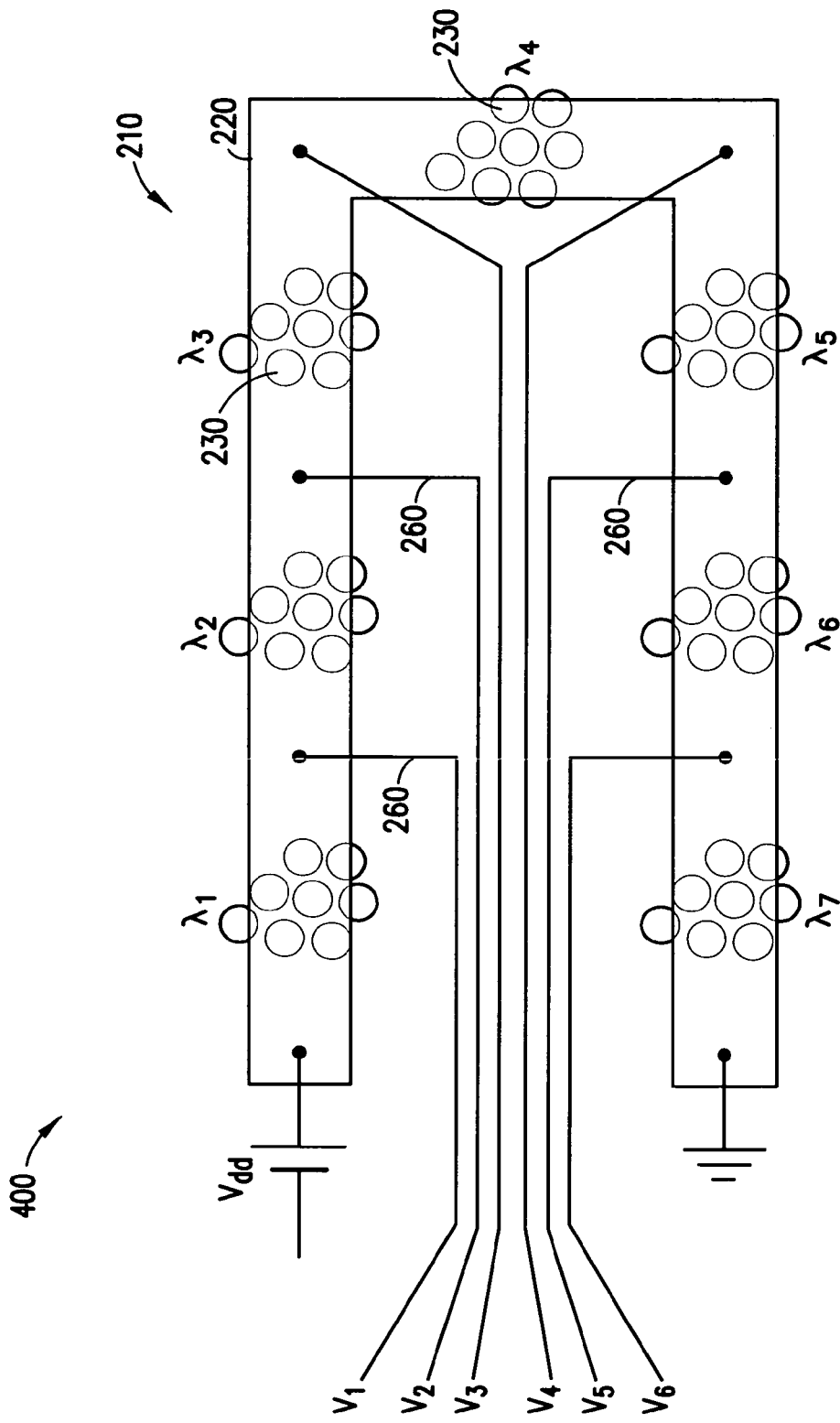
FIG. 4 is another exemplary embodiment of a photodetector comprising bandwidth phototransistors arranged in series.

Referring now to FIG. 4, another exemplary embodiment of a photodetector for use as a chromatic eye is illustrated and designated generally by the reference number 400. Chromatic eye 400 is arranged to have a serial configuration in which phototransistors 210 having three or more QD domains sensitive to different bandwidths are combined in a linear sequence (i.e. with a single graphene film 220 (ribbon) acting as channel and in contact with all the variable band-gap QD domains). As with previous embodiments, one side of the graphene film 220 is connected to the input voltage source ($V_{dd}$) and the other side of the graphene film 220 is connected to ground 155. The output probes 260 are output terminals positioned between consecutive domain pairs.

One advantage of the serial arrangement geometry is that for a fixed $V_{dd}$ a much lower current flows through the channel as compared to a parallel configuration, and this translates into a lower power consumption for the chromatic eye 400.

The serial configuration also provides a more compact architecture than the parallel array. Furthermore, the serial arrangement geometry allows for desirable performance if the analysis of the spectral data (e.g., via a process) is relying on machine learning algorithms to classify different ambient-light patterns for contextualization purposes.

Figure 5:
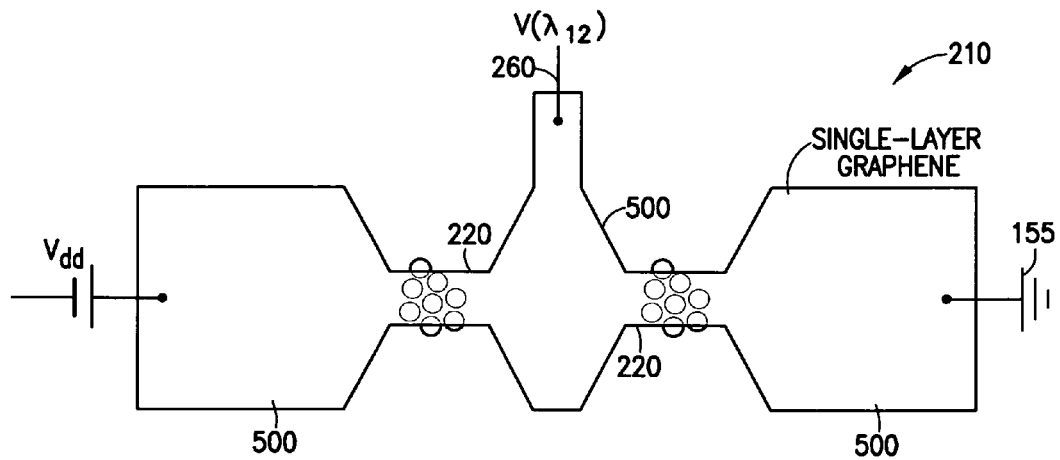
FIG. 5 is one exemplary embodiment of an all-graphene phototransistor illustrating one type of interconnect geometry.

Although the phototransistor 210 as described herein can easily be made quite small and transparent, the phototransistor 210 includes three terminals that are connected to processing electronics (e.g., $V_{(dd)}$, the voltage probe 260, and ground 155) some distance away from the transparent area. As shown in FIG. 5, connection to the processing electronics is made via conducting means such as transparent (or substantially transparent) interconnects 500 that are integral with or coupled to portions of the graphene film 220. The interconnects 500 may be graphene, thereby defining an all-graphene device in order to minimize cost and to enhance mechanical flexibility to comply with future deformable devices. The graphene may be arranged as a monolayer. The interconnects 500 are not limited to being graphene, however, as other materials such as conducting oxides (e.g., indium tin oxides and the like) may be used.

For the phototransistor 210 to deliver optimum performance, the modulated portions of the channels (i.e. those portions in contact with the QDs 230) comprise the most resistive parts of the circuit. If the interconnects 500 exhibit a comparable resistance, then overall current modulation under light will be reduced. If monolayer graphene is used for the interconnects 500 to facilitate transparency or the phototransistor 210, the resistance constrictions overlap with the QD domains.

Expanding the width of the interconnects 500 relative to the graphene film 220 affects the total device size. As an estimate, the channel constrictions defined by the graphene film 220 can be about 10 micrometers (μm) in width, while the interconnects are made ten times wider (e.g., about 100 μm). This means that a whole transparent chromatic eye 300, 400, either in a parallel or serial configuration, can still fit into a relatively small area (an area about one millimeter square), which is a considerable improvement as compared to current ambient-light sensors.

In one exemplary method of fabricating the chromatic eye 300, 400, graphene films 220 are deposited by chemical vapor deposition (CVD) and transferred to transparent (or substantially transparent) substrates such as glass or plastic that are suitable for the chromatic eye application. The shaping of the channel and interconnects can be performed using optical lithographic and etching techniques.

The QDs 230 are produced by solution methods and are assembled on the final substrate. In one exemplary method of producing and assembling the QDs 230, the QD domains are inkjet-printed onto substrates. Other methods such as selective binding via appropriate functionalization are also possible.

In some exemplary embodiments, QDs 230 spanning a large range of band-gaps but with similar chemical properties are desirable. Thus, rather than choosing different semiconductor materials for different regions of the spectrum, it is possible to alter confinement effects in the QDs 230 to tune their absorption onset. In particular, a suitable material with a relatively small bang-gap can be selected, and the absorption onset of blue color can shifted by decreasing the diameters of the QDs 230 to about the 4-20 nanometer (nm) range. (QDs 230 of this size may be obtained with narrow size distributions.)

In any embodiment, the graphene film 220 can be placed both below and above to QD domains with similar or even equivalent results. If at least two layers of QDs 30 are used, a desirable sensitivity/transparency ratio would be achieved by disposing an equal number of CD lavers below and above the graphene film 220.

Figure 6:
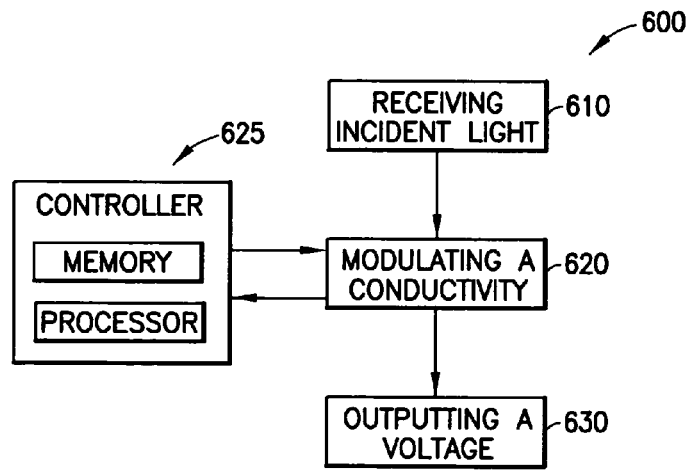
FIG. 6 is a flowchart of one exemplary embodiment of a method of using a chromatic eye for spectral discrimination.

Referring now to FIG. 6, one exemplary method of using a chromatic eye for spectral discrimination is illustrated generally at 600 and is hereinafter referred to as "method 600." In a receiving step 610 of method 600, incident light is received on first and second types of QDs 230 located in contact with the grapheme film 220. The QDs 230 are located as monolayers on the graphene film 220. In a modulating step 620, a conductivity of the graphene film 220 based on wavelengths of the received incident light is modulated. An analysis step 625 is carried out in which wavelength data is spectrally analyzed by a controller having a memory and a processor. In an outputting step 630, a voltage is output (based on the spectral analysis) from a point of the graphene film 220 located between the first type of QDs 230 and the second type of QDs 230.

In one exemplary embodiment, an apparatus comprises a graphene film; a first arrangement of quantum dots of a first type located in contact with the graphene film as a first monolayer; a second arrangement of quantum dots a second type located in contract with the graphene film as a second monolayer; a source of input voltage connected to an end of the graphene film; and an output voltage probe connected one graphene film between the first arrangement of quantum dots and the second arrangement of quantum dots.

In another exemplary embodiment, a method comprises receiving incident light on a first arrangement of quantum dots of a first type located in contact with a first graphene film as a first monolayer and on a second arrangement of quantum dots of a second type located in contact with the first graphene film as a second monolayer; modulating a conductivity of the first graphene film based on wavelengths of the received incident light; and outputting a voltage from a point between the first arrangement of quantum dots and the second arrangement of quantum dots.

In another exemplary embodiment, a non-transitory computer readable storage medium, comprising one or more sequences of one or more instructions which, when executed by one or more processors of an apparatus, cause the apparatus to at least: modulate a conductivity of a graphene film based on wavelengths of a received incident light; and output a voltage from a point between a first arrangement of quantum dots and a second arrangement of quantum dots on the graphene film.

It should be understood that the foregoing description is only illustrative. Various alternatives and modifications can be devised by those skilled in the art. For example, features recited in the various dependent claims could be combined with each other in any suitable combination(s). In addition, features from different embodiment described above could be selectively combined into a new embodiment. Accordingly, the description is intended to embrace all such alternatives, modifications, and variances which fall within the scope of the appended claims.

What is claimed is:

1. An apparatus, comprising:
   a graphene film;
   a first arrangement of quantum dots of a first type located in contact with the graphene film as a first monolayer;
   a second arrangement of quantum dots of a second type located in contact with the graphene film as a second monolayer;
   an input voltage source connected to an end of the graphene film; and
   an output voltage probe connected to the graphene film between the first arrangement of quantum dots and the second arrangement of quantum dots.

2. The apparatus of claim 1, wherein the quantum dots of the first type differ from the quantum dots of the second type with regard to band-gap energy.

3. The apparatus of claim 2, wherein the quantum dots of the first type and the quantum dots of the second type are selected narrow the band-gap difference therebetween.

4. The apparatus of claim 1, wherein a plurality of graphene films having fir and second arrangements of quantum dots located in contact therewith are arranged in a parallel configuration with the input voltage source connected to one end of each graphene film.

5. The apparatus of claim 1, further comprising interconnects made integral with or coupled to the graphene film to connect the graphene film to processing electronics.

6. The apparatus of claim 5, wherein the interconnects comprise conducting means.

7. The apparatus of claim 5, wherein the interconnects are on the order of about ten times as wide as the graphene film.

8. The apparatus of claim 5, wherein the interconnects comprise graphene or indium tin oxides.

9. The apparatus of claim 1, wherein a second graphene film is positioned on the quantum dots of the first type and the quantum dots of the second type.

10. A method, comprising:
    receiving incident light on a first arrangement of quantum dots of a first type located in contact with a first graphene film as a first monolayer and on a second arrangement of quantum dots of a second type located in contact with the first graphene film as a second monolayer;
    modulating a conductivity of the first graphene film based on wavelengths of the received incident light; and
    outputting a voltage from a point between the first arrangement of quantum dots and the second arrangement of quantum dots.

11. The method of claim 10, wherein light through the first arrangement of quantum dots and through the second arrangement of dots is of a wavelength that is less than the wavelength of the received incident light such that a current through the first graphene film varies while the output voltage is substantially constant.

12. The method of claim 10, wherein the wavelength of the received incident light is greater than a wavelength of light through the first arrangement of quantum dots and less than a wavelength of light through the second arrangement of quantum dots such that the output voltage varies.

13. The method of claim 10, wherein modulating a conductivity of the first graphene film based on wavelengths of light allows for spectral discrimination over a range of wavelengths.

14. The method of claim 13, further comprising processing data using a processor to determine spectral discrimination.

15. The method of claim 10, further comprising receiving incident light on a third arrangement of quantum dots of the second type located in contact with a second graphene film as a third monolayer and on a fourth arrangement of quantum dots of a third type located in contact with the second graphene film as a fourth monolayer, wherein the first graphene film and the second graphene film are arranged in parallel.

16. A non-transitory computer readable storage medium, comprising one more sequences of one or more instructions which, when executed by one or more processors of an apparatus, cause the apparatus to at least:

modulate a conductivity of a graphene film based on wavelengths of a received incident light; and
output a voltage from a point between a first arrangement of quantum dots and a second arrangement of quantum dots on the graphene film.

* * * * *

UNITED STATES PATENT AND TRADEMARK OFFICE
CERTIFICATE OF CORRECTION

PATENT NO.        : 9,130,085 B2
APPLICATION NO.   : 13/857484
DATED             : September 8, 2015
INVENTOR(S)       : Colli It is certified that error appears in the above-identified patent and that said Letters Patent is hereby corrected as shown below:

In the claims

Claim 3, col. 8, line 9 --to-- should be inserted in between --selected-- and --narrow--.

Claim 4, col. 8, line 11 "fir" should be deleted and --first-- should be inserted.

Claim 11, col. 8, line 40 --quantum-- should be inserted in between --of-- and --dots--.

Signed and Sealed this
Fifteenth Day of December, 2015

Michelle K. Lee
*Director of the United States Patent and Trademark Office*